US006204591B1

(12) United States Patent
Nariai

(10) Patent No.: US 6,204,591 B1
(45) Date of Patent: Mar. 20, 2001

(54) PIEZOELECTRIC DRIVING CIRCUIT

(75) Inventor: Kyoichi Nariai, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/234,220

(22) Filed: Jan. 19, 1999

(30) Foreign Application Priority Data

Jan. 16, 1998 (JP) .......... 10-020409

(51) Int. Cl.[7] .......... H01K 41/09
(52) U.S. Cl. .......... 310/316.03
(58) Field of Search .......... 310/316.03

(56) References Cited

U.S. PATENT DOCUMENTS 4,947,074 * 8/1990 Suzuki .......... 310/316.03
5,130,598 * 7/1992 Verheyen et al. .......... 310/316.03

FOREIGN PATENT DOCUMENTS 53-48518 5/1978 (JP) .......... B06B/1/00
54-109436 8/1979 (JP) .......... B41J/3/04
62-296317 12/1987 (JP) .......... H01H/57/00
2-145344 6/1990 (JP) .......... B41J/2/295
4-351200 12/1992 (JP) .......... H01L/11/08
5-330095 12/1993 (JP) .......... B41J/3/10
7-231247 8/1995 (JP) .......... H03K/5/04
7-274558 10/1995 (JP) .......... H02N/2/00

* cited by examiner

*Primary Examiner*—Thomas M. Dougherty
(74) *Attorney, Agent, or Firm*—Foley & Lardner

(57) ABSTRACT

Disclosed is a piezoelectric driving circuit which has: a first switching element and a first resistor, which are in series connected, being inserted between a high-potential side power source and a piezoelectric element; and a second switching element and a second resistor, which are in series connected, being inserted between a low-potential side power source and the piezoelectric element; wherein charging path is formed by turning on the first switching element and discharging path is formed by turning on the second switching element, so that a desired piezoelectric driving voltage waveform is produced.

2 Claims, 9 Drawing Sheets

PIEZOELECTRIC DRIVING CIRCUIT

FIELD OF THE INVENTION

This invention relates to a piezoelectric driving circuit, and more particularly to, a piezoelectric driving waveform generating circuit with low consumed power and low heat generation.

BACKGROUND OF THE INVENTION

FIG. 1 shows an example of a conventional piezoelectric driving waveform generating circuit. As shown in FIG.1, it is composed such that to piezoelectric driving waveform generated in a reference waveform generating circuit, a current amplifying circuit supplies as much current as necessary.

In this case, given that piezoelectric driving voltage (piezoelectric driving waveform output terminal voltage) is Vpzt (FIG. 2(*a*)), collector current of transistor Tr1 is i1 (FIG. 2(*b*) collector current of transistor Tr2 is i2 (FIG. 2(*c*)), and high-potential side power source (high-voltage side power source) is Vh, energies P1, P2 to be generated at transistors Tr1, Tr2, respectively are given by:

$$P1=(Vh-Vpzt)\times i1$$

$$P2=Vpzt\times i2$$

which are represented by FIGS. 2(*d*), (*e*), respectively.

Since these energies generated are all heat generation from transistors, conventional devices cope with the situation by providing a high-rating transistor or heat sink. This prevents the devices from being miniaturized.

SUMMARY OF THE INVENTION

Accordingly, it is an object of the invention to provide a piezoelectric driving circuit that the size of device can be miniaturized while achieving the low consumed power and low heat generation.

According to the invention, a piezoelectric driving circuit, comprises:

a first switching element and a first resistor, which are in series connected, being inserted between a high-potential side power source and a piezoelectric element; and a second switching element and a second resistor, which are in series connected, being inserted between a low-potential side power source and the piezoelectric element;

wherein charging path is formed by turning on the first switching element and discharging path is formed by turning on the second switching element, so that a desired piezoelectric driving voltage waveform is produced.

According to another aspect of the invention, a piezoelectric driving circuit, comprises:

a plurality of circuits composed of a switching element and a resistor, which are in series connected, being in parallel inserted between a high-potential side power source and a piezoelectric element; and a plurality of circuits composed of a switching element and a resistor, which are in series connected, being in parallel inserted between a low-potential side power source and the piezoelectric element.

BRIEF DESCRIPTION OF THE DRAWINGS

The invention will be explained in more detail in conjunction with the appended drawings, wherein.

DESCRIPTION OF THE PREFERRED EMBODIMENTS

The preferred embodiments of the invention are explained below.

In a piezoelectric driving circuit of the preferred embodiment, a first switching element and a first resistor, which are in series connected, are inserted between a high-potential side power source and a piezoelectric element, whereby charging path by the on-off control is formed, and a second switching element and a second resistor, which are in series connected, are inserted between a low-potential side power source and the piezoelectric element.

Whereby discharging path by the on-off control is formed, so that a desired piezoelectric driving voltage waveform is produced.

Figure 1:
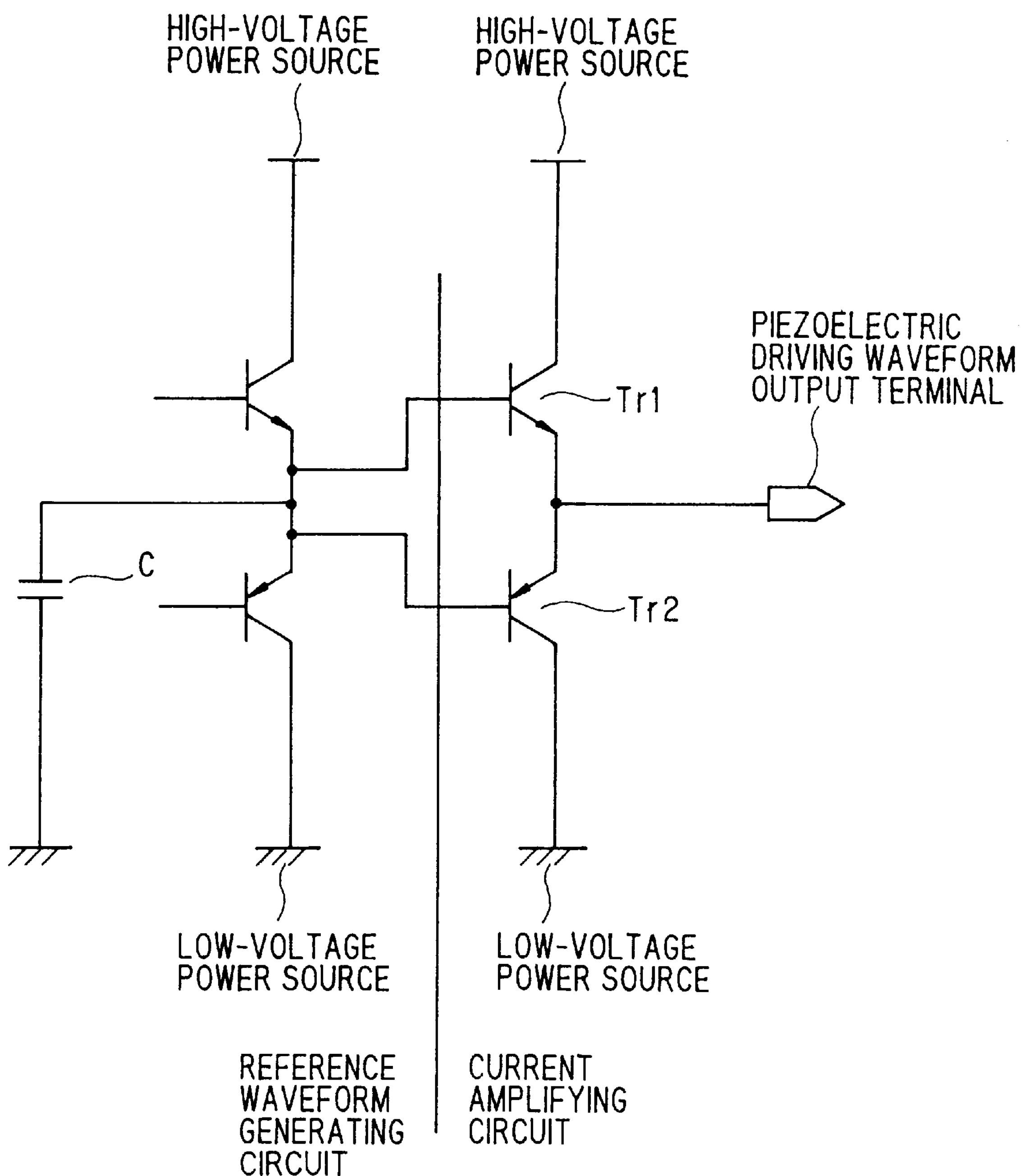
FIG. 1 is a circuit diagram showing a conventional piezoelectric driving circuit.
Figure 2:
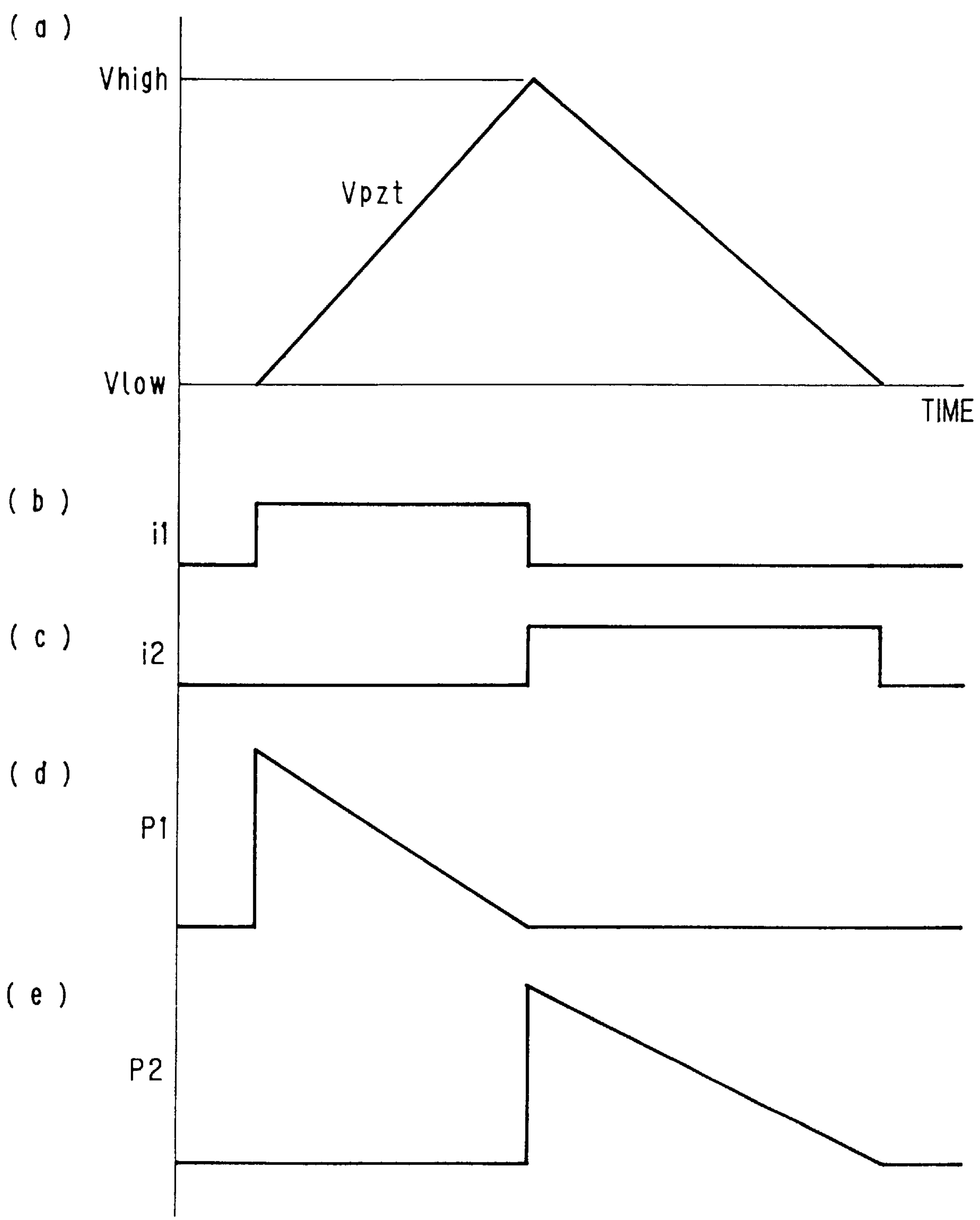
FIG. 2 is an illustrative diagram showing the operation timing waveform of the conventional piezoelectric driving circuit.
Figure 3:
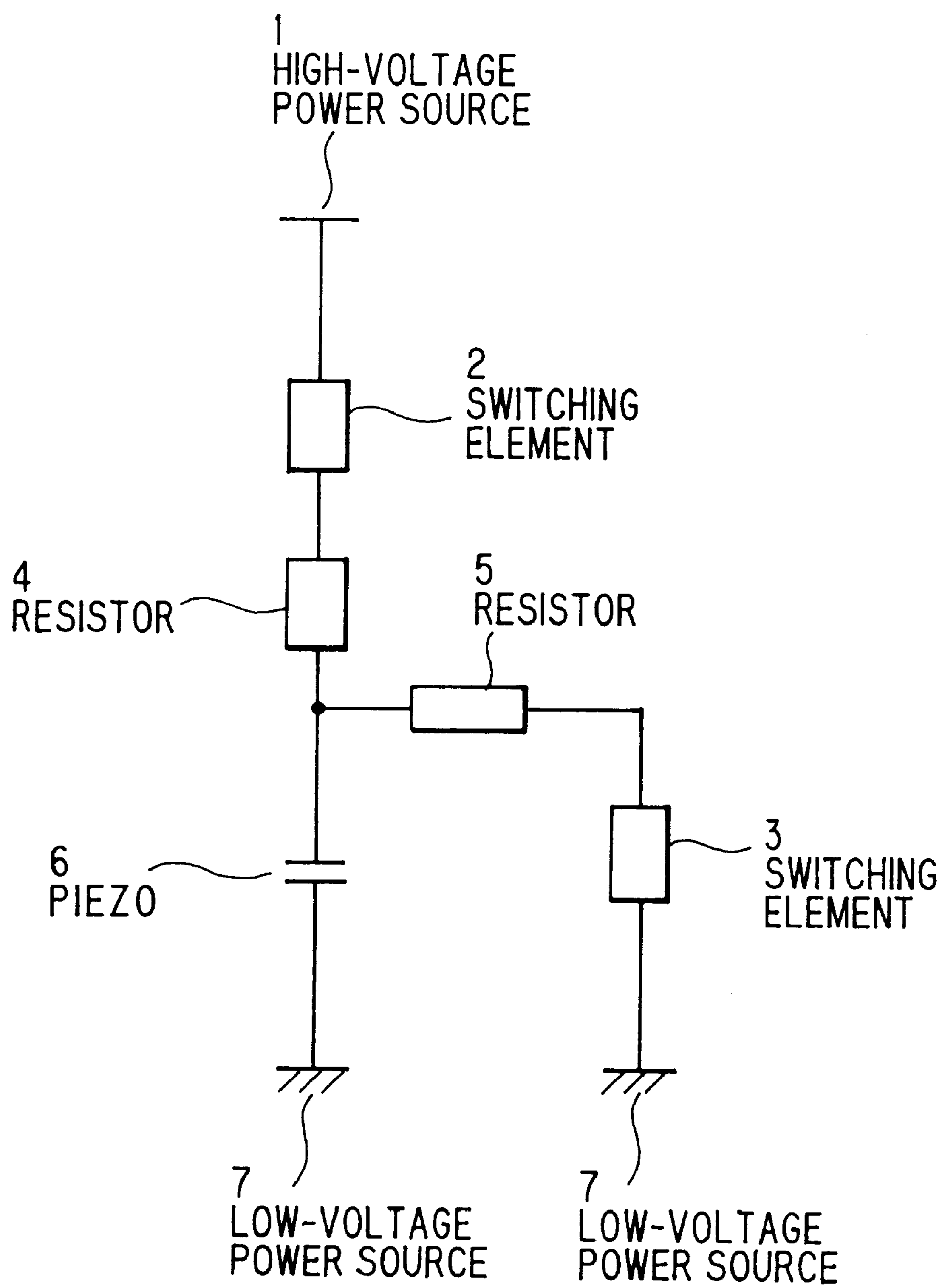
FIG. 3 is a circuit diagram showing a piezoelectric driving circuit in a first preferred embodiment according to the invention.

FIG. 3 shows a composition of the first preferred embodiment of the invention. Referring to FIG. 3, in a piezoelectric driving circuit in the first embodiment of the invention, a piezoelectric element 6 is charged through a resistor4 for a certain time by turning on a switching element 2 connected to a high-potential side power source 1, then turning off the switching element 2, then turning on a switching element 3 to discharge the piezoelectric element 6 through a resistor 5, thereby generating the driving waveform of the piezoelectric element 6.

The switching element 2, which is connected between the high-potential side power source 1 and one end of the resistor 4, conducts the on/off control of current supply to the piezoelectric element 6.

Another end of the resistor 4 is connected to the piezoelectric element 6, its resistivity R1 is determined such that the time constantr $\tau$=R1×Cpzt of the upward curve of voltage waveform (rising waveform) applied to the piezoelectric element 6 is suitable to drive the piezoelectric element. R1 is the resistivity of the resistor 4, and Cpzt is the static capacitance of the piezoelectric element 6.

The switching element 3 is connected between a low-potential power source 7 and one end of a resistor 5, and conducts the control of discharging from piezoelectric element 6. Another end of the resistor 5 is connected to the piezoelectric element 6, and its resistivity R2 is determined such that the time constant τ=R2×Cpzt of the downward curve of voltage waveform (falling waveform) applied to the piezoelectric element 6 is suitable to drive the piezoelectric element. R2 is the resistivity of the resistor 5.

Figure 4:
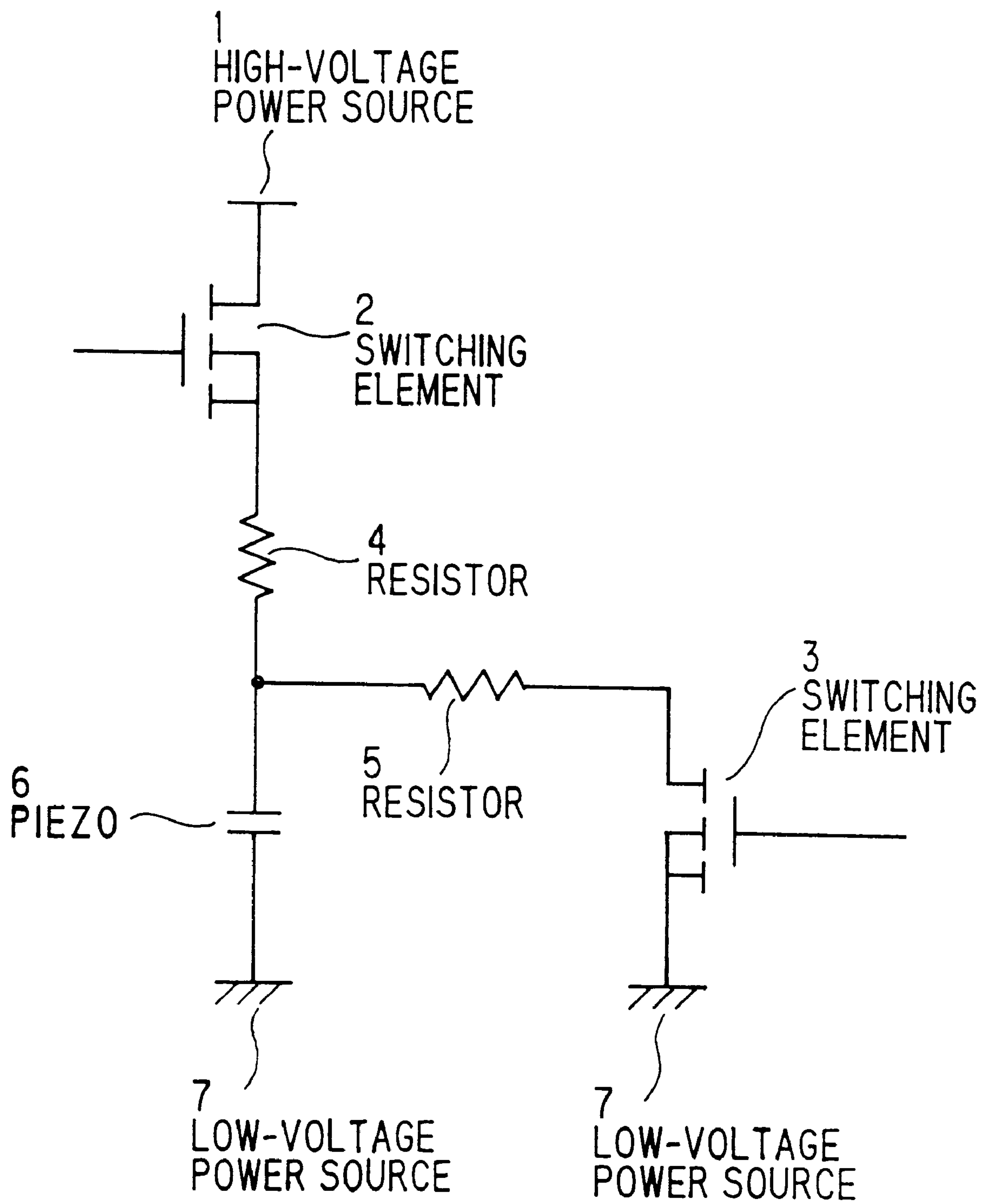
FIG. 4 is a circuit diagram showing in detail the piezoelectric driving circuit in the first embodiment.

The first embodiment of the invention is in detail explained below, referring to the drawings. FIG. 4 shows a detailed composition of the first embodiment of the invention.

Referring to FIG. 4, in this embodiment, as the switching element 2 and switching element 3, a N-channel MOSFET is used.

The drain terminal of the switching element 2 is connected to the high-potential side power source 1, and its source terminal is connected to one end of the resistor 4. To the gate terminal of the switching element 2, a control signal that are valid (High level) only for a time period to charge the piezoelectric element 6 is applied.

The drain terminal of the switching element 3 is connected to one end of the resistor 5, and its source terminal is connected to the low-potential side power source 7. To the gate terminal of the switching element 3, a control signal that are valid (High level) only for a time period to discharge the piezoelectric element 6 is applied.

The piezoelectric element 6 is connected to another ends of the resistor 4 and resistor 5 so that the time constant can be changed between in charging and in discharging. The charging is conducted through the resistor 4 and the discharging is conducted through the resistor 5.

Figure 5:
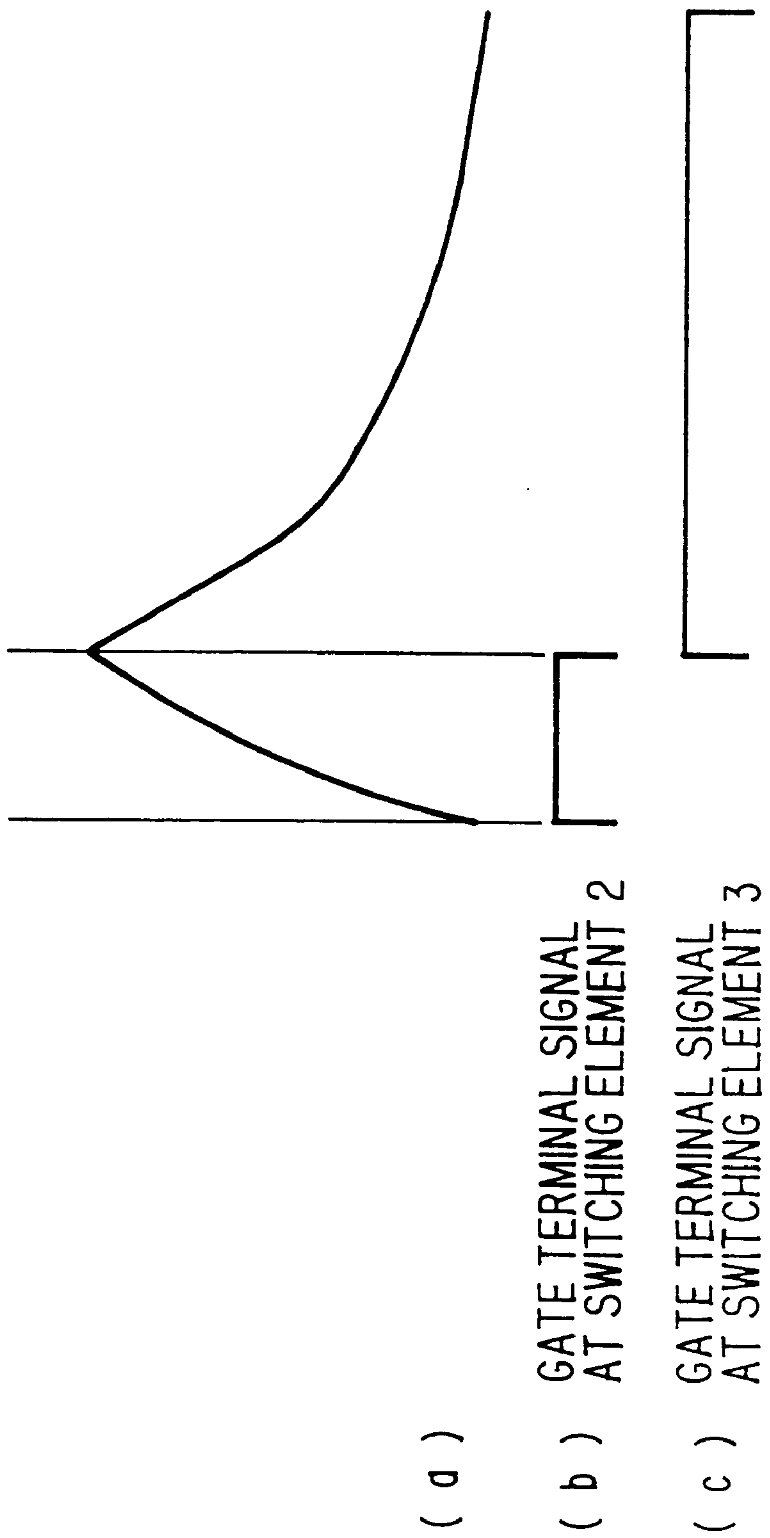
FIG. 5 is an illustrative diagram showing the operation timing waveform of the first embodiment.

FIG. 5 shows timing waveforms for explaining the operations of this embodiment. FIG. 5(*b*) is a waveform of control signal to be input to the gate terminal of the switching element 2, and FIG. 5(*c*) is a waveform of control signal to be input to the gate terminal of the switching element 3.

Referring to FIGS. 4 and 5, the operations of the first embodiment of the invention are explained below.

A waveform that the triangle wave used to drive the piezoelectric element 6 is approximated by exponential curve (exponential function) is produced as below.

To the high-potential side power source 1 to which the switching element 2 is connected, a voltage higher than the maximum voltage of piezoelectric driving waveform is supplied.

Provided that the maximum voltage of piezoelectric driving waveform, i.e., voltage applied to the piezoelectric element 6 is Vpzt_pk, voltage of the high-potential side power source is set to be, for example, higher than Vh=Vpzt_pk/0.63.

This constant, 0.63 is a ratio of voltage of the piezoelectric element 6 to the high-potential side power source 1 after the time constant τ=R1×Cpzt when charging the static capacitance Cpzt of the piezoelectric element 6 through the resistor 4 from the high-potential side power source 1.

More in detail, it is represented by expression: Vpzt=Vh×(1-exp(−t/(R1×Cpzt))). If t=τ=R1×Cpzt, then Vpzt=Vh×0.63 is obtained by the expression. Vh is voltage of the high-potential side power source, Vpzt is voltage of the piezoelectric element 6, R1 is resistivity of the resistor 4, and Cpzt is capacitance of the piezoelectric element 6.

Figure 6:
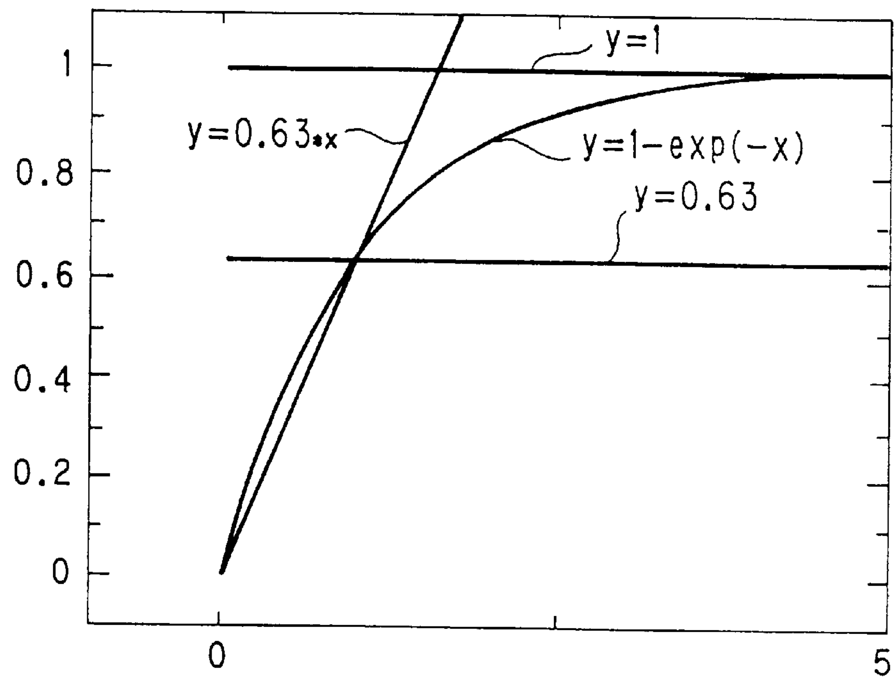
FIG. 6 is a graph showing the increase of voltage applied to the piezoelectric element in the first embodiment.

FIG. 6 shows a graph showing charging characteristics of the piezoelectric element 6, where, in the expression: Vpzt=Vh×(1-exp(−t/(R1×Cpzt))), Vh=1 and R1×Cpzt (=t)=1 are given. In FIG. 6, the axis y of ordinates represents a ratio of Vpzt/Vh, the abscissa axis represents time, and the characteristic curve y=1-exp(−t) corresponds to Vpzt=Vh×(1-exp(−t/(R1×Cpzt))). When time t is equal to the time constant τ, i.e. 1, y=1-exp(−t)=1-exp(1)=1-0.37=0.63 is given.

As understood from FIG. 6, within less than time τ, the above expression can be approximated into straight line with a slope of 0.63.

Although voltage applied to the piezoelectric element 6 increases as shown in FIG. 5(*a*) when inputting a control signal shown in FIG. 5(*b*) to the gate terminal of the switching element 2, the charging to the piezoelectric element 6 is performed in the region where the curvature (slope) of the exponential curve is not so steep.

Therefore, the charging waveform similar to that in charging the piezoelectric element 6 with constant current can be obtained.

Next, the case that the low-potential side power source 7 is connected to GND (ground) is explained.

When inputting control signal shown in FIG. 5(*c*) to the gate terminal of the switching element 3, electric charge stored in the piezoelectric element 6 flows through the resistor 5 and the switching element 3 into GND.

At this moment, voltage Vpzt of the piezoelectric element 6 decreases as shown in FIG. 5(*a*). By changing the value of the resistor 5, the voltage slope of the piezoelectric element 6 in the discharging can be controlled.

As described above, the driving waveform of the piezoelectric element 6 can be obtained by the two switching elements and two resistors.

Also, when the switching element 2 and switching element 3 are of MOS-FET with low ON-resistivity, loss generated at that MOS-FET when flowing current through the switching element 2, 3 can be kept down.

Figure 7:
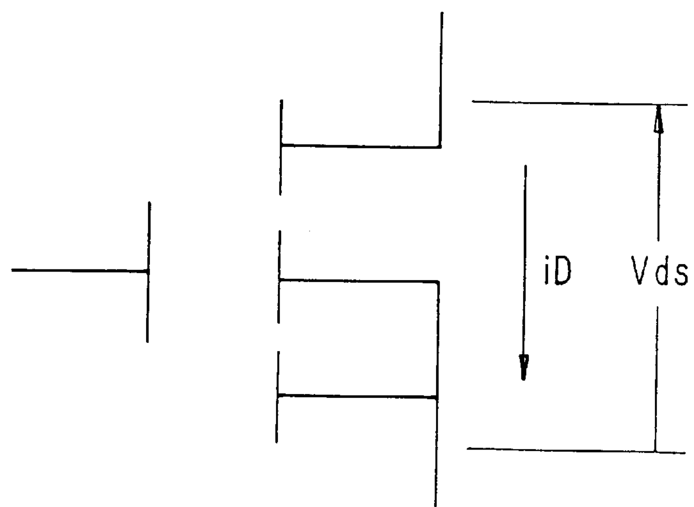
FIG. 7 is an illustration showing a switching element (Nch MOSFET) in the first embodiment.

FIG. 7 shows the N-channel MOSFET to compose the switching element 2 in FIG. 4. iD is current to flow through MOS-FET 2, and Vds is voltage to be applied between its drain and source.

Figure 8:
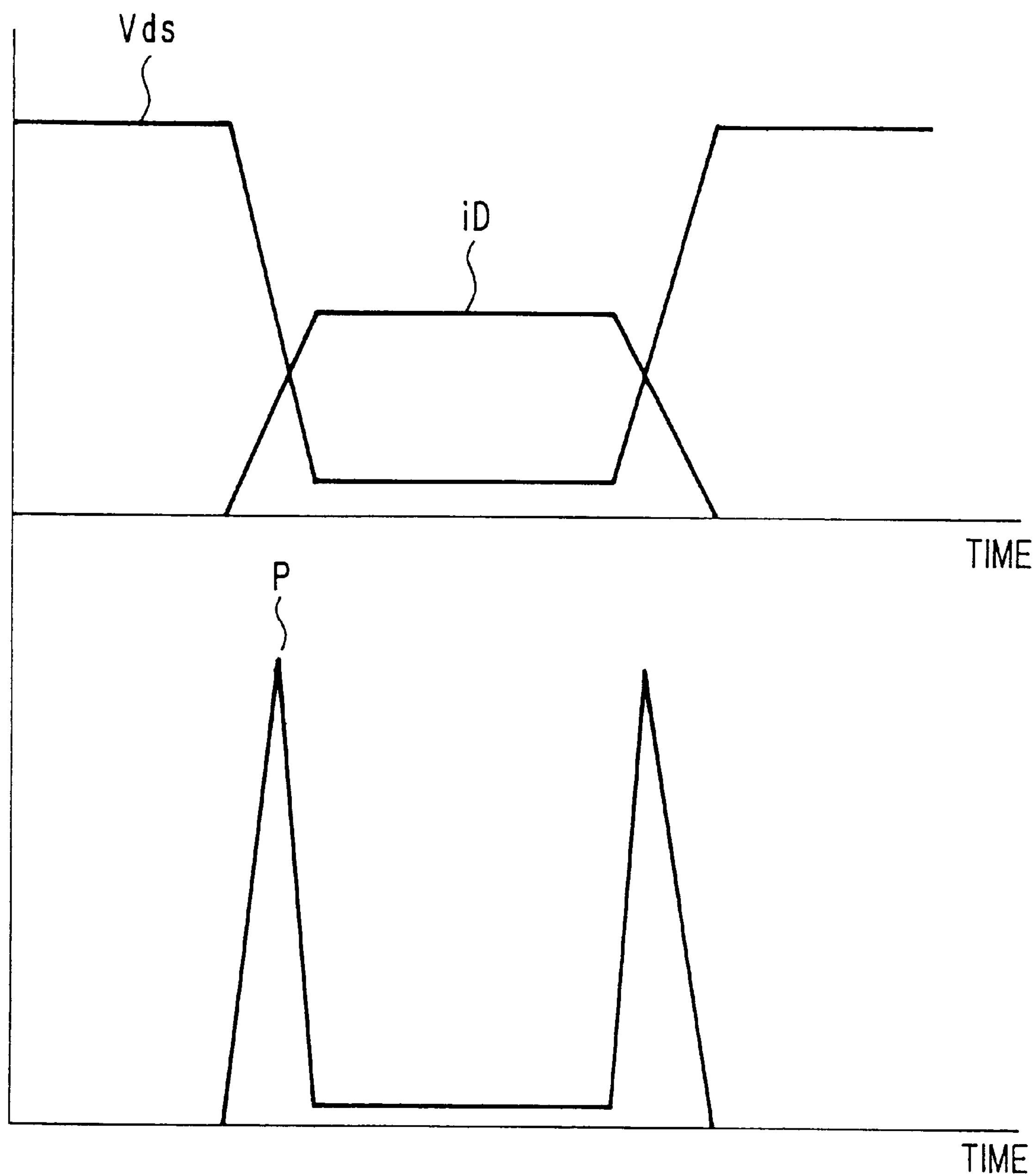
FIG. 8 is an illustrative diagram showing waveforms of voltage, current and voltage-current of Nch MOSFET in the first embodiment.

FIG. 8 shows drain current iD, drain-source voltage Vds and the product P of these when the N-channel MOS-FET composing the switching element 2 is shifted OFF to ON, then further turned ON. Referring to FIG. 8, iD, Vds and P of the switching element 2 are explained below.

When the switching element 2 is turned off, iD is zero, where Vds=Vh is given. Since P is expressed by P=iD×Vds, P hereupon is zero.

In the transition state that the switching element 2 is shifting from ON to OFF, the drain current is increasing as the drain-source voltage Vds is decreasing, and therefore the peak of P appears hereupon.

By using FET with fast switching speed, the rising and falling of Vds, iD are accelerated, therefore the loss in switching can be reduced.

When the switching element 2 is turned on, Vds=iD×Ron is generated by ON-resistivity Ron of the switching element 2 and current iD flown.

Although P is given by P=iD×Vds, P can be kept down by selecting MOSFET with sufficient ON-resistivity Ron.

Figure 9:
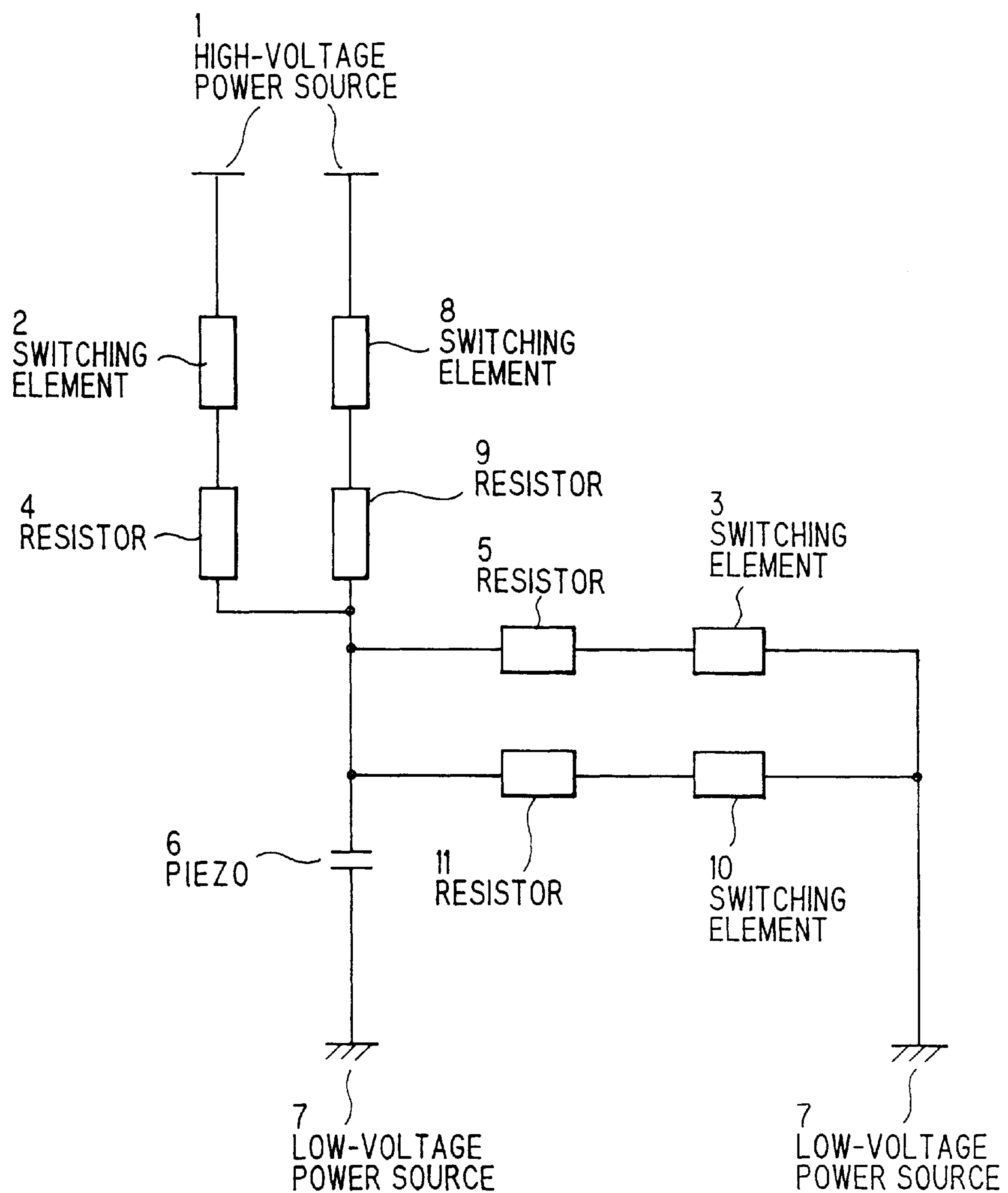
FIG. 9 is a circuit diagram showing a piezoelectric driving circuit in a second preferred embodiment according to the invention.

FIG. 9 shows a composition of the second preferred embodiment of the invention. Although in the first embodiment two switching elements and resistors each are used for the charging and discharging, in the second embodiment, as shown in FIG. 9, series connections of a switching element and a resistor for charging path and discharging path are in parallel connected. Thereby, as the driving waveform of the piezoelectric element 6, a driving waveform with a slope, as shown in FIG. 10(*a*), close to that of straight line can be produced.

In the second embodiment of the invention, the resistivity of the resistor 4 is set to be higher than that of a resistor 9, and the resistivity of a resistor 11 is set to be lower than that of the resistivity 5.

Figure 10:
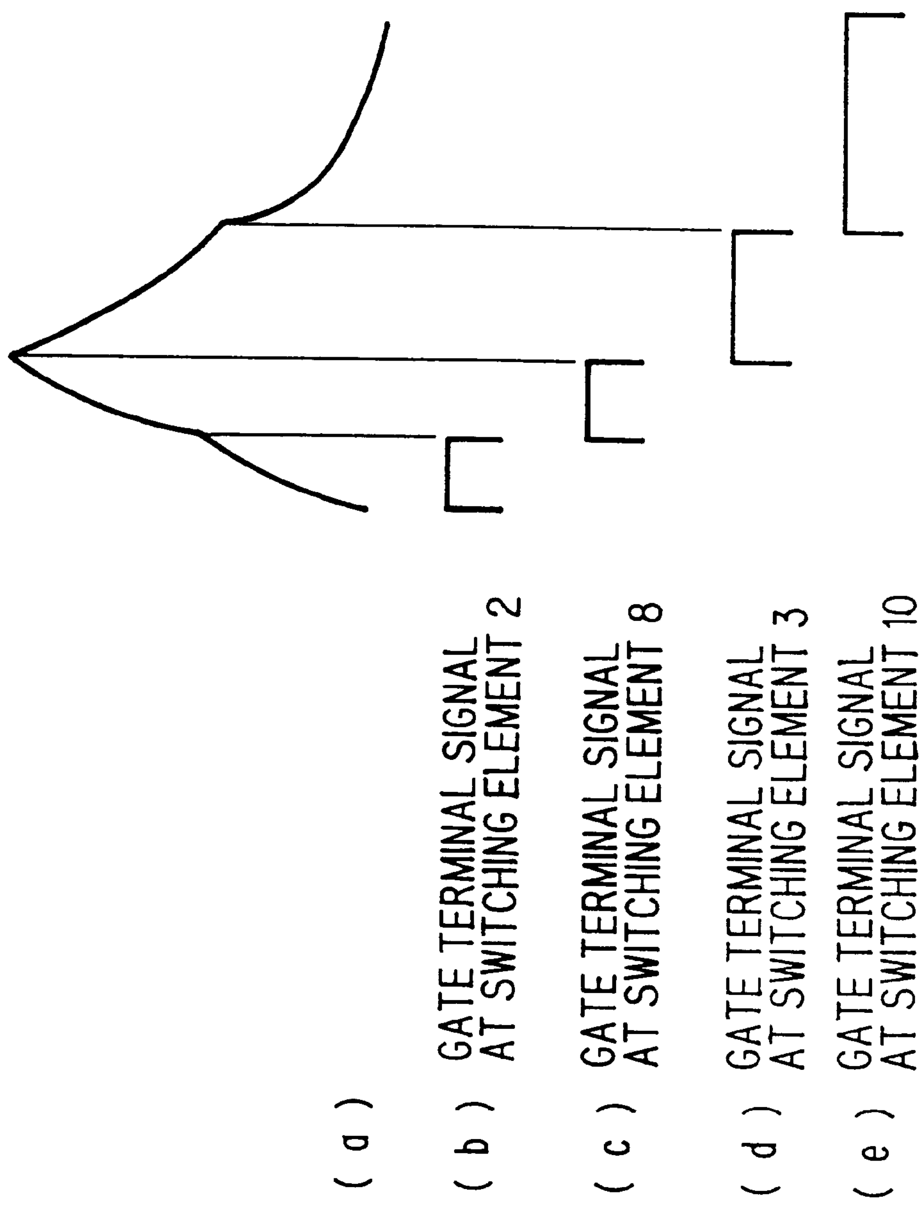
FIG. 10 is an illustrative diagram showing the operation timing waveform of the first embodiment.

The driving timings of the switching elements 2, 8, 3 and 10 are controlled as shown in FIGS. 10(*b*), (*c*), (*d*) and (*e*), thereby the waveform in FIG. 10(*a*) can be obtained.

Although in FIG. 9 there are provided two kinds of resistors, more than two kinds of resistors may be, of course, provided. Also, by providing one kind of resistor and multiple kinds of high-potential side power source and low-potential side power source, similar result can be obtained.

Although, in the embodiments described above, GND is used as the low-potential side power source, a negative power source or a power source with lower voltage than the high-potential side power source may be used therein.

Although, in the embodiments described above, MOS-FET is used as the switching element, a bipolar transistor whose characteristic satisfies necessary specifications can be sufficient to use.

Advantages of the Invention

As described above, in this invention, the electric power loss of switching element can be reduced and the heat generation from switching element can be reduced, thereby attaining the miniaturization of device.

The reason is that the switching element is used in saturation state when turned on and in cut-off region when turned off. Namely, in saturation region, Vds at both ends of the switching element is nearly equal to zero, and, in cut-off region, current iD flowing through the switching element is zero. Therefore, the energy $P = Vds \times iD$ generated at switching element is only loss at the time of switching shown in FIG. 8, and the heat generation can be thus reduced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A piezoelectric driving circuit, comprising:

a first plurality of circuits, each composed of a switching element connected in series with a resistor, each of the first plurality of circuits being connected in parallel and being inserted between a high-potential side power source and a piezoelectric element, each of the resistors of the first plurality of circuits having a different resistance for providing a different time constant in association with a capacitance of the piezoelectric element; and a second plurality of circuits, each composed of a switching element connected in series with a resistor, each of the second plurality of circuits being connected in parallel and being inserted between a low-potential side power source and the piezoelectric element, each of the resistors of the second plurality of circuits having a different resistance for providing a different time constant in association with the capacitance of the piezoelectric element.

2. A method for driving a piezoelectric element, comprising:

driving the piezoelectric element with a high potential by successively operating switching elements of a first plurality of circuits, each composed of a switching element connected in series with a resistor, each of the first plurality of circuits being connected in parallel and being inserted between a high potential power source and a piezoelectric element, each of the resistors of the first plurality of circuits having a different resistance for providing a different time constant in association with a capacitance of the piezoelectric element; and driving the piezoelectric element with a low potential by successively operating switching elements of a second plurality of circuits, each composed of a switching element connected in series with a resistor, each of the second plurality of circuits being connected in parallel and being inserted between a low potential power source and the piezoelectric element, each of the resistors of the second plurality of circuits having a different resistance for providing a different time constant in association with the capacitance of the piezoelectric element.

* * * * *